(12) United States Patent
Albers et al.

(10) Patent No.: US 10,373,844 B2
(45) Date of Patent: Aug. 6, 2019

(54) INTEGRATED CIRCUIT PACKAGE CONFIGURATIONS TO REDUCE STIFFNESS

(71) Applicant: INTEL IP CORPORATION, Santa Clara, CA (US)

(72) Inventors: Sven Albers, Regensburg (DE); Sonja Koller, Regensburg (DE); Thorsten Meyer, Regensburg (DE); Georg Seidemann, Landshut (DE); Christian Geissler, Teugn (DE); Andreas Wolter, Regensburg (DE)

(73) Assignee: INTEL IP CORPORATION, Santa Clara, CA (US)

( * ) Notice: Subject to any disclaimer, the term of this patent is extended or adjusted under 35 U.S.C. 154(b) by 0 days.

(21) Appl. No.: 15/590,890

(22) Filed: May 9, 2017

(65) Prior Publication Data

US 2017/0345678 A1    Nov. 30, 2017

Related U.S. Application Data

(60) Continuation of application No. 15/182,434, filed on Jun. 14, 2016, now Pat. No. 9,653,324, which is a
(Continued)

(51) Int. Cl.
*H01L 21/56* (2006.01)
*H01L 23/00* (2006.01)
(Continued)

(52) U.S. Cl.
CPC .............. *H01L 21/56* (2013.01); *H01L 21/78* (2013.01); *H01L 23/3128* (2013.01);
(Continued)

(58) Field of Classification Search
CPC .............. H01L 23/3128; H01L 23/562; H01L 23/49816; H01L 23/49827; H01L 23/481;
(Continued)

(56) References Cited

U.S. PATENT DOCUMENTS 9,006,871 B2 *   4/2015   Fujisawa ............. H01L 23/3107
                                                            257/663
9,142,481 B2 *   9/2015   Kim .................... H01L 23/4334
(Continued)

OTHER PUBLICATIONS

Non-Final Office Action dated Nov. 5, 2015 in U.S. Appl. No. 14/189,938, 8 pages.
(Continued)

*Primary Examiner* — Hoa B Trinh
(74) *Attorney, Agent, or Firm* — Schwabe, Williamson & Wyatt, P.C.

(57) ABSTRACT

Embodiments of the present disclosure are directed towards an integrated circuit (IC) package including a die having a first side and a second side disposed opposite to the first side. The IC package may further include an encapsulation material encapsulating at least a portion of the die and having a first surface that is adjacent to the first side of the die and a second surface disposed opposite to the first surface. In embodiments, the second surface may be shaped such that one or more cross-section areas of the IC package are thinner than one or more other cross-section areas of the IC package. Other embodiments may be described and/or claimed.

4 Claims, 8 Drawing Sheets

Related U.S. Application Data division of application No. 14/189,938, filed on Feb. 25, 2014, now Pat. No. 9,397,019.

(51) Int. Cl.
  *H01L 23/31* (2006.01)
  *H01L 21/78* (2006.01)

(52) U.S. Cl.
  CPC ............ H01L 23/562 (2013.01); H01L 24/97 (2013.01); *H01L 21/568* (2013.01); *H01L 24/96* (2013.01); *H01L 2224/04105* (2013.01); *H01L 2224/12105* (2013.01); *H01L 2924/12042* (2013.01); *H01L 2924/15311* (2013.01); *H01L 2924/181* (2013.01); *H01L 2924/1815* (2013.01); *H01L 2924/3511* (2013.01)

(58) Field of Classification Search
  CPC ............... H01L 23/50; H01L 2924/181; H01L 2924/12042; H01L 2924/3511; H01L 2924/15311; H01L 2924/1815; H01L 24/97; H01L 24/49; H01L 24/85
  See application file for complete search history.

(56) References Cited

U.S. PATENT DOCUMENTS

2008/0258317 A1    10/2008  Ejima
2014/0346667 A1*   11/2014  Han ..................... H01L 23/3128
                                                          257/737
2015/0289382 A1*   10/2015  Takeuchi ............... H05K 1/115
                                                          174/266

OTHER PUBLICATIONS

Notice of Allowance dated Mar. 28, 2016 in U.S. Appl. No. 14/189,938, 9 pages.
Non-Final Office Action dated Aug. 12, 2016 in U.S. Appl. No. 15/182,434, 10 pages.
Notice of Allowance dated Jan. 27, 2017 in U.S. Appl. No. 15/182,434, 9 pages.

* cited by examiner

Fig. 9

INTEGRATED CIRCUIT PACKAGE CONFIGURATIONS TO REDUCE STIFFNESS

CROSS REFERENCE TO RELATED APPLICATIONS

This application is a continuation application of U.S. patent application Ser. No. 15/182,434, entitled "INTEGRATED CIRCUIT PACKAGE CONFIGURATIONS TO REDUCE STIFFNESS", filed Jun. 14, 2016 which is a divisional application of U.S. patent application Ser. No. 14/189,938, entitled "INTEGRATED CIRCUIT PACKAGE CONFIGURATIONS TO REDUCE STIFFNESS", filed Feb. 25, 2014, now U.S. Pat. No. 9,397,019, and claims priority to the Ser. Nos. 15/182,434 and 14/189,938 applications. The disclosures of Ser. Nos. 15/182,434 and 14/189,938 are hereby fully incorporated by reference.

FIELD

Embodiments of the present disclosure generally relate to the field of integrated circuits, and more particularly, to integrated circuit package configurations to reduce stiffness and increase reliability of package connections.

BACKGROUND

Integrated circuit (IC) packages are composed of a number of different materials. These materials may vary from material contained in a die to molding material to various metals contained in electrical routing features and interconnect structures, to name a few. To further complicate this, a package substrate or circuit board, to which an IC package may be coupled, may also be composed of an array of materials. Each of these materials, in an IC package, a package substrate, or a circuit board, may have varying coefficients of thermal expansion. A coefficient of thermal expansion represents the change in volume a material may experience based upon a change in temperature of the material. Because materials contained in an IC package, package substrate, or circuit board may have different coefficients of thermal expansion, as the temperature of the various materials change the stresses imposed on the IC package, package substrate, or circuit board may change as well. These stresses may be especially apparent at the location where the IC package couples with a package substrate or circuit board because the location of the coupling may be subject to the stresses of both the IC package and of the package substrate or circuit board to which the IC package is coupled. As a result, the coupling may be a point of failure when the stresses surpass what the coupling is capable of enduring.

The background description provided herein is for the purpose of generally presenting the context of the disclosure. Unless otherwise indicated herein, the materials described in this section are not prior art to the claims in this application and are not admitted to be prior art by inclusion in this section.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings. Unless clearly indicated otherwise, these drawings are not to scale.

FIG. 9 is a graphical illustration representing the results of a simulated temperature cycling on board (TCoB) test utilizing an integrated circuit (IC) package in accordance with some embodiments of the present disclosure.

DETAILED DESCRIPTION

Figure 1:
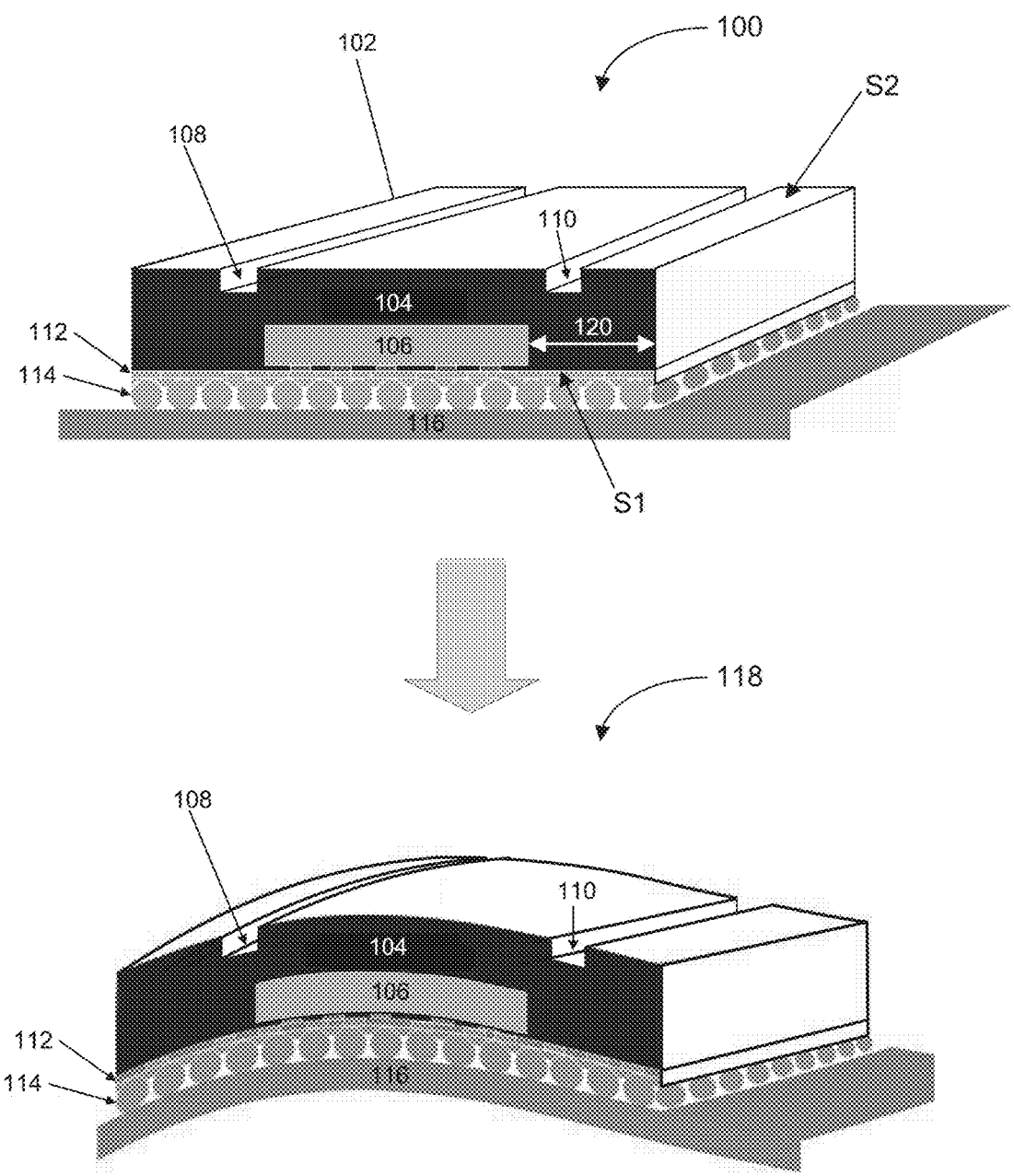
FIG. 1 schematically illustrates a cross-section side view of an example integrated circuit (IC) assembly including an IC package electrically and physically coupled with circuit board in both an unstressed state and a stressed state, in accordance with embodiments of the present disclosure.

Embodiments of the present disclosure describe integrated circuit package configurations to reduce stiffness and increase reliability of package connections. For example, techniques and configurations described herein may be directed towards integrated circuit packages having one or more cross-section areas that are thinner than one or more other cross-section areas. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group) and/or memory (shared, dedicated, or group) that execute one or more software or firmware programs, a combinational logic circuit, and/or other suitable components that provide the described functionality.

FIG. 1 schematically illustrates a cross-section side view of an example integrated circuit (IC) assembly including IC package 102 electrically and physically coupled with circuit board 116 in both an unstressed state 100 and a stressed state 118, in accordance with embodiments of the present disclosure. In embodiments, the IC package 102 may include one or more dies (e.g. die 106) at least partially encapsulated in an encapsulation material 104. In some embodiments, IC package 102 may have a redistribution layer 112. Redistribution layer 112 may be configured to electrically couple die 106 with one or more interconnect structures (e.g., solder balls 114). The interconnect structures may be configured to electrically and physically couple IC package 102 with a package substrate or circuit board (e.g., circuit board 116). The IC package 102 may be attached to circuit board 116 according to a variety of suitable configurations including a flip configuration or wirebonding configuration. While depicted herein as solder balls 114, interconnect structures may include pillars, or other suitable structures in place of, or in addition to, solder balls 114 that may electrically couple the IC package 102 with circuit board 116. The IC package 102 may represent a discrete chip made from a semiconductor material and may be, include, or be a part of a processor, memory, or ASIC in some embodiments.

In some embodiments encapsulation material 104 may be a molding compound. As mentioned above, the encapsulation material 104 may encapsulate at least a portion of die 106 and may form a first surface S1, upon which redistribution layer 112 may be disposed and a second surface S2, opposite S1, which may also form a surface of IC package 102. In embodiments, surface S2 may be shaped such that one or more cross sectional areas of IC package 102 may be thinner than one or more other cross sectional areas of IC package 102. In embodiments, the thinner cross sectional area may be formed in an area between a terminating edge of die 106 and a terminating edge of IC package 102, this area is depicted by arrow 120. These thinner cross sectional areas may reduce the rigidity of IC package 102 and, as a result, may reduce the stress imposed on IC package 102, including the stress imposed on the interconnect structures coupling IC package 102 to circuit board 116. In some embodiments, surface S2 may have trenches 108 and 110 formed therein to realize the thinner cross-section areas. Trenches 108 and 110 may be configured to reduce the rigidity of the package but maintain sufficient rigidity for package placement.

Circuit board 116 may include electrical routing features configured to route electrical signals to or from IC package 102. The electrical routing features may include, for example, traces disposed on one or more surfaces of the circuit board and/or internal routing features such as, for example, trenches, vias or other interconnect structures through which to route electrical signals.

The circuit board 116 may be a printed circuit board (PCB) composed of an electrically insulative material such as an epoxy laminate. For example, the circuit board 116 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. The circuit board 116 may be composed of other suitable materials in other embodiments. In some embodiments, the circuit board 116 may be a motherboard (e.g., motherboard 1202 of FIG. 12).

In some embodiments, IC package 102 may be coupled with a package substrate and the package substrate may in turn be coupled to a circuit board, such as circuit board 116. In such embodiments, package-level interconnects such as, for example, solder balls or land-grid array (LGA) structures may be coupled to one or more lands on the package substrate and one or more pads on circuit board 116 to form corresponding solder joints that are configured to further route the electrical signals between the package substrate and circuit board 116. Other suitable techniques to physically and/or electrically couple a package substrate with circuit board 116 may be used in other embodiments.

In embodiments, such as when voltage is applied to IC package 102, the temperature of the material contained within IC package 102 and circuit board 116 may increase and as a result the material contained with the IC package 102 and circuit board 116 may expand or contract in a manner consistent with a coefficient of thermal expansion of the material. This expansion or contraction of the individual materials may result in an amount of stress experienced by IC package 104, circuit board 116, and solder balls 114. This stress is demonstrated by the flexing of IC package 102 and circuit board 116 in stressed state 118. In such a stressed state, the areas of IC package 102 that have been made thinner (e.g., trenches 108 and 110) may reduce the rigidity of the of IC package 102 and consequently reduce the stress imposed on IC package 102, circuit board 116, and solder balls 114.

Figure 2:
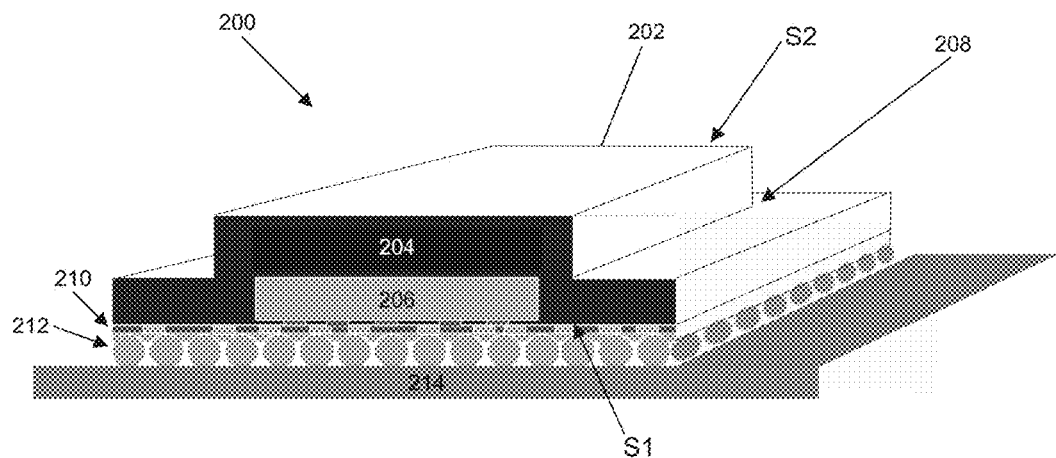
FIG. 2 schematically illustrates a cross-section side view of an example integrated circuit (IC) assembly having a stepped edge, in accordance with some embodiments of the present disclosure.

FIG. 2 schematically illustrates a cross-section side view of an example integrated circuit (IC) assembly 200. In embodiments, IC package 202 may include one or more dies (e.g. die 206) at least partially encapsulated in an encapsulation material 204. In some embodiments, IC package 202 may have a redistribution layer 210. Redistribution layer 210 may be configured to electrically couple die 206 with one or more interconnect structures (e.g., solder balls 212). The interconnect structures may be configured to electrically and physically couple IC package 202 with a package substrate or circuit board (e.g., circuit board 214). The IC package 202 may be attached to circuit board 214 according to a variety of suitable configurations including, a flip configuration or wirebonding configuration. While depicted herein as solder balls 212, interconnect structures may include pillars, or other suitable structures in place of, or in addition to, solder balls 212 that may electrically couple IC package 202 with circuit board 214. The IC package 202 may represent a discrete chip made from a semiconductor material and may be, include, or be a part of a processor, memory, or ASIC in some embodiments.

In some embodiments encapsulation material 204 may be a molding compound. As mentioned above, the encapsulation material 204 may encapsulate at least a portion of die 206 and may form a first surface S1, upon which redistribution layer 210 may be disposed and a second surface S2, opposite S1, which may also form a surface of IC package 202. In embodiments, surface S2 may be shaped such that one or more cross sectional areas of IC package 202 may be thinner than one or more other cross sectional areas of IC package 202. These thinner cross sectional areas may reduce the rigidity of IC package 202 and, as a result, may reduce the stress imposed on IC package 202, including the stress imposed on the interconnect structures coupling IC package 202 to circuit board 216, due to thermal expansion of the materials contained therein. As depicted, surface S2 may have one or more steps (e.g., step 208) formed therein to realize the thinner cross-section areas. Step 208 may be configured to both reduce the rigidity of the package but maintain sufficient rigidity for package placement. While depicted as a singles step, in other embodiments, any number of steps may be utilized.

Figure 3:
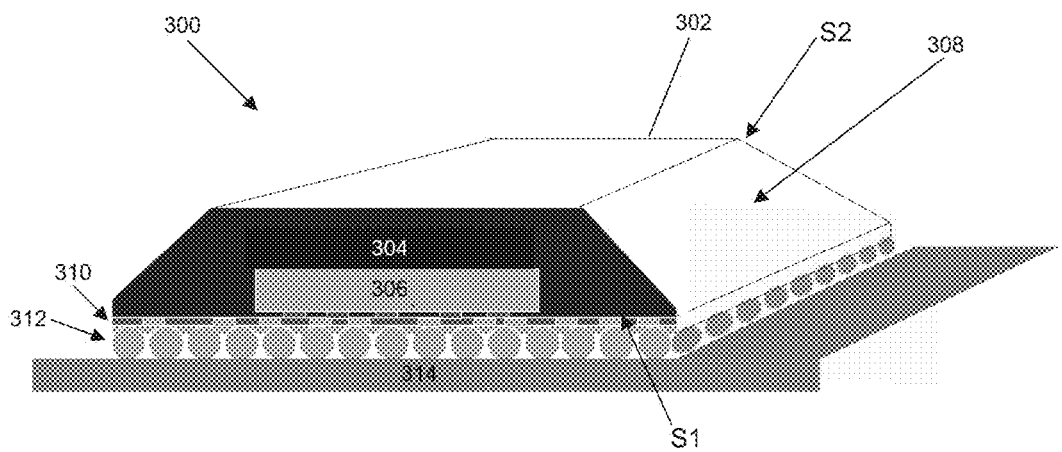
FIG. 3 schematically illustrates a cross-section side view of an example integrated circuit (IC) assembly having a beveled, or chamfered, edge in accordance with some embodiments of the present disclosure.

FIG. 3 schematically illustrates a cross-section side view of an example integrated circuit (IC) assembly 300. In embodiments, IC package 302 may include one or more dies (e.g. die 306) at least partially encapsulated in an encapsulation material 304. In some embodiments, IC package 302 may have a redistribution layer 310. Redistribution layer 310 may be configured to electrically couple die 306 with one or more interconnect structures (e.g., solder balls 312). The interconnect structures may be configured to electrically and physically couple IC package 302 with a package substrate or circuit board (e.g., circuit board 314). The IC package 302 may be attached to circuit board 314 according to a variety of suitable configurations including, a flip configuration or a wirebonding configuration. While depicted herein as solder balls 312, interconnect structures may include pillars, or other suitable structures in place of, or in addition to, solder balls 312 that may electrically couple IC package 302 with circuit board 314. The IC package 302 may represent a discrete chip made from a semiconductor material and may be, include, or be a part of a processor, memory, or ASIC in some embodiments.

In some embodiments encapsulation material 304 may be a molding compound. As mentioned above, the encapsulation material 304 may encapsulate at least a portion of die 306 and may form a first surface S1, upon which redistribution layer 310 may be disposed and a second surface S2, opposite S1, which may also form a surface of IC package 302. In embodiments, surface S2 may be shaped such that one or more cross sectional areas of IC package 302 may be thinner than one or more other cross sectional areas of IC package 302. These thinner cross sectional areas may reduce the rigidity of IC package 302 and, as a result, may reduce the stress imposed on IC package 302, including the stress imposed on the interconnect structures coupling IC package 302 to circuit board 316, due to thermal expansion of the materials contained therein. In some embodiments, surface S2 may have one or more beveled, or chamfered, edges (e.g., bevel 308) formed therein to realize the thinner cross-section areas. Bevel 308 may be configured to both reduce the rigidity of the package but maintain sufficient rigidity for package placement. As used herein, a beveled edge may be an edge that intersects surface S1 at an angle of less than 90 degrees and surface S2 at an angle of more than 90 degrees to form a slanted edge that lies in a single plain. A cross-section of a beveled edge may be generally trapezoidal in nature. A chamfered edge, on the other hand, may refer to an edge intersecting two adjacent sides resulting in an edge having two or more planes. In embodiments, the adjacent sides may be perpendicular to one another resulting in a vertical plane formed by a first side, a horizontal plane formed by a second side, and a slanted plane intersecting the two sides to create a chamfered profile.

Figure 4:
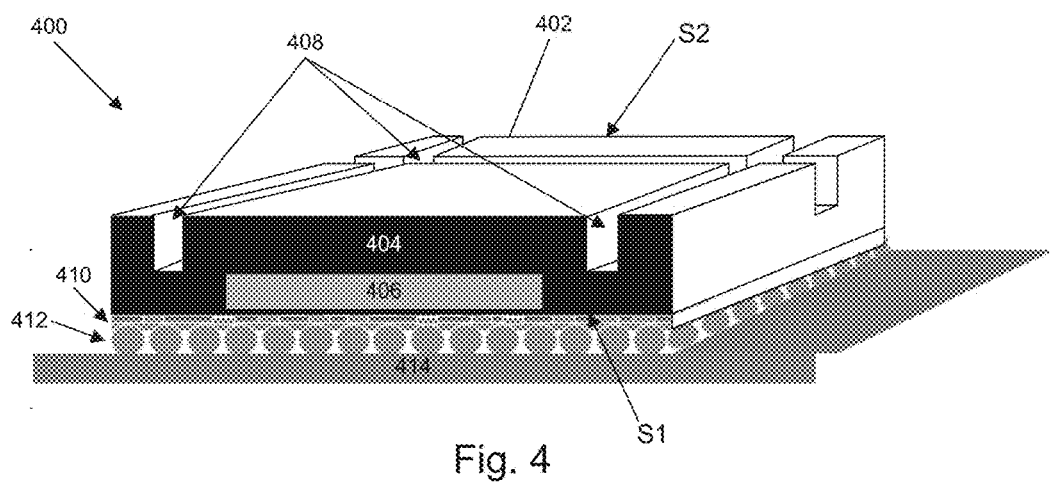
FIG. 4 schematically illustrates a cross-section side view of an example integrated circuit (IC) assembly having trenches integrated therein, in accordance with some embodiments of the present disclosure.

FIG. 4 schematically illustrates a cross-section side view of an example integrated circuit (IC) assembly 400. In embodiments, IC package 402 may include one or more dies (e.g. die 406) at least partially encapsulated in an encapsulation material 404. In some embodiments, IC package 402 may have a redistribution layer 410. Redistribution layer 410 may be configured to electrically couple die 406 with one or more interconnect structures (e.g., solder balls 412). The interconnect structures may be configured to electrically and physically couple IC package 402 with a package substrate or circuit board (e.g., circuit board 414). The IC package 402 may be attached to circuit board 414 according to a variety of suitable configurations including, a flip configuration, as depicted, or other configurations such as a wirebonding configuration. In the flip configuration, the IC package 402 may be attached to a surface of circuit board 414 using solder balls 412. While depicted herein as solder balls 412, interconnect structures may include pillars, or other suitable structures in place of, or in addition to, solder balls 412 that may electrically couple IC package 402 with circuit board 414. The IC package 402 may represent a discrete chip made from a semiconductor material and may be, include, or be a part of a processor, memory, or ASIC in some embodiments.

In some embodiments encapsulation material 404 may be a molding compound. As mentioned above, the encapsulation material 404 may encapsulate at least a portion of die 406 and may form a first surface S1, upon which redistribution layer 410 may be disposed and a second surface S2, opposite S1, which may also form a surface of IC package 402. In embodiments, surface S2 may be shaped such that one or more cross sectional areas of IC package 402 may be thinner than one or more other cross sectional areas of IC package 402. These thinner cross sectional areas may reduce the rigidity of IC package 402 and, as a result, may reduce the stress imposed on IC package 402, including the stress imposed on the interconnect structures coupling IC package 402 to circuit board 416, due to thermal expansion of the materials contained therein. In some embodiments, surface S2 may have trenches 408 formed therein. In embodiments, trenches 408 may be formed such that the trenches form a perimeter around die 406. Trenches 408 may be configured to both reduce the rigidity of the package but maintain sufficient rigidity for package placement.

Figure 5:
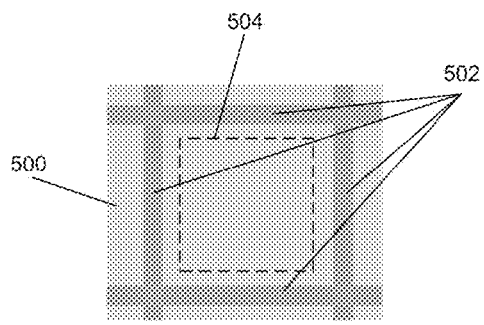
FIGS. 5-7 illustrate top down views of various trench orientations, in accordance with some embodiments of the present disclosure.
Figure 6:
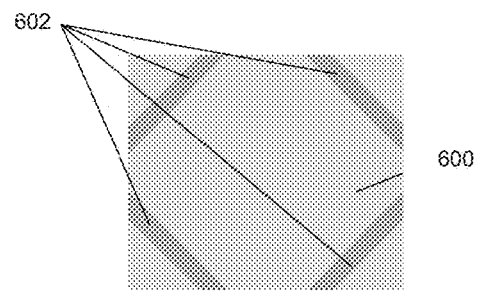
Figure 7:
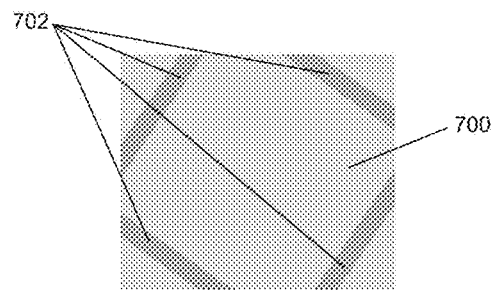

FIGS. 5-7 illustrate top down views of various trench orientations, in accordance with some embodiments of the present disclosure. FIG. 5 illustrates trenches 502 formed on IC package 500 to achieve the thinner cross sectional areas. In embodiments, trenches 502 may be formed such that the trenches form a perimeter around the embedded die. This perimeter may be formed in an area outside of a peripheral edge of the die. Such a peripheral edge of the die is depicted by box 504. FIG. 6 illustrates trenches 602 formed on IC package 600. In embodiments, trenches 602 may form a 45 degree angle with a first side of the IC package and may extend to intersect an adjacent side of the IC package at a 45 degree angle. FIG. 7 illustrates trenches 702 formed on IC package 700. In embodiments, trenches may be formed extending from one side of IC package 700 to an adjacent side of IC package 700 and may intersect the one side and the adjacent side at varying angles. In some embodiments, all four trenches might have individually different angles and in such embodiments may not form a square.

Figure 8:
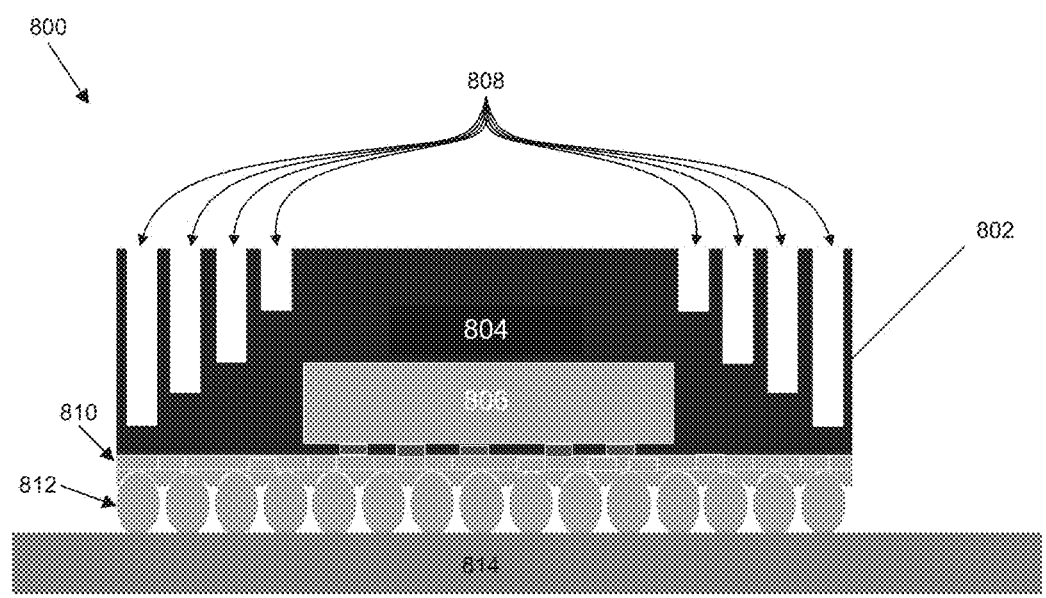
FIG. 8 schematically illustrates a cross-section side view of an example integrated circuit (IC) assembly with trenches having various depths integrated therein, in accordance with some embodiments of the present disclosure.

FIG. 8 schematically illustrates a cross-section side view of an example integrated circuit (IC) assembly 800. In embodiments, IC package 802 may include one or more dies (e.g. die 806) at least partially encapsulated in an encapsulation material 804. In some embodiments, IC package 802 may have a redistribution layer 810. Redistribution layer 810 may be configured to electrically couple die 806 with one or more interconnect structures (e.g., solder balls 812). The interconnect structures may be configured to electrically and physically couple IC package 802 with a package substrate or circuit board (e.g., circuit board 814). The IC package 802 may be attached to circuit board 814 according to a variety of suitable configurations including, a flip configuration or wirebonding configuration. In the flip configuration, the IC package 802 may be attached to a surface of circuit board 814 using solder balls 812. While depicted herein as solder balls 812, interconnect structures may include pillars, or other suitable structures in place of, or in addition to, solder balls 812 that may electrically couple IC package 802 with circuit board 814. The IC package 802 may represent a discrete chip made from a semiconductor material and may be, include, or be a part of a processor, memory, or ASIC in some embodiments.

In some embodiments encapsulation material 804 may be a molding compound. As mentioned above, the encapsulation material 804 may encapsulate at least a portion of die 806 and may form a first surface S1, upon which redistribution layer 810 may be disposed and a second surface S2, opposite S1, which may also form a surface of IC package 802. In embodiments, surface S2 may be shaped such that one or more cross sectional areas of IC package 802 may be thinner than one or more other cross sectional areas of IC package 802. These thinner cross sectional areas may reduce the rigidity of IC package 802 and, as a result, may reduce the stress imposed on IC package 802, including the stress imposed on the interconnect structures coupling IC package 802 to circuit board 816, due to thermal expansion of the materials contained therein. In some embodiments, surface S2 may have trenches 808 formed therein. In embodiments, a plurality of trenches 808 may be formed at various depths to achieve the thinner cross-section areas. Trenches 808 may be configured to reduce the rigidity of the package but maintain sufficient rigidity for package placement. In some embodiments, these trenches may have a metallic layer disposed thereon which may aid in dissipation of heat from IC package 802.

Figure 9:
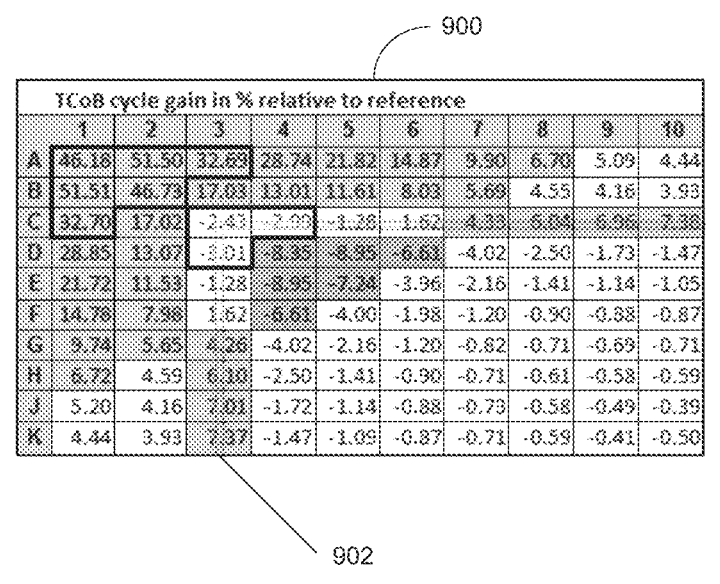

FIG. 9 is a graphical illustration representing the results of a simulated temperature cycling on board (TCoB) test utilizing an integrated circuit (IC) package in accordance with embodiments of the present disclosure. Graph 900 depicts the results of TCoB tests carried out on an IC package utilizing trenches in the configuration, as depicted in FIG. 5, above, to achieve the thinner cross-section areas. Line 902 represents the edge of the die in the IC package with respect to the placement of the balls in the ball grid array. Graph 900 represents a 10×10 matrix of a corner section of a 20×20 ball grid array disposed on the IC package where each value represents a reading corresponding with a single ball of the ball grid array.

The values in graph 900 represent the percentage gain of TCoB cycles over a reference IC package having a uniform thickness. For example, in graph 900 the percentage gain of 17.02 in block (C, 2) represents the ball of the ball grid array that is located 2 positions in and 3 positions down from the corner of the IC package. As can be seen, the balls towards the corners of the ball grid array experience a very large percentage increase in the number of TCoB cycles that can be sustained prior to failure over the reference IC package.

Figure 10:
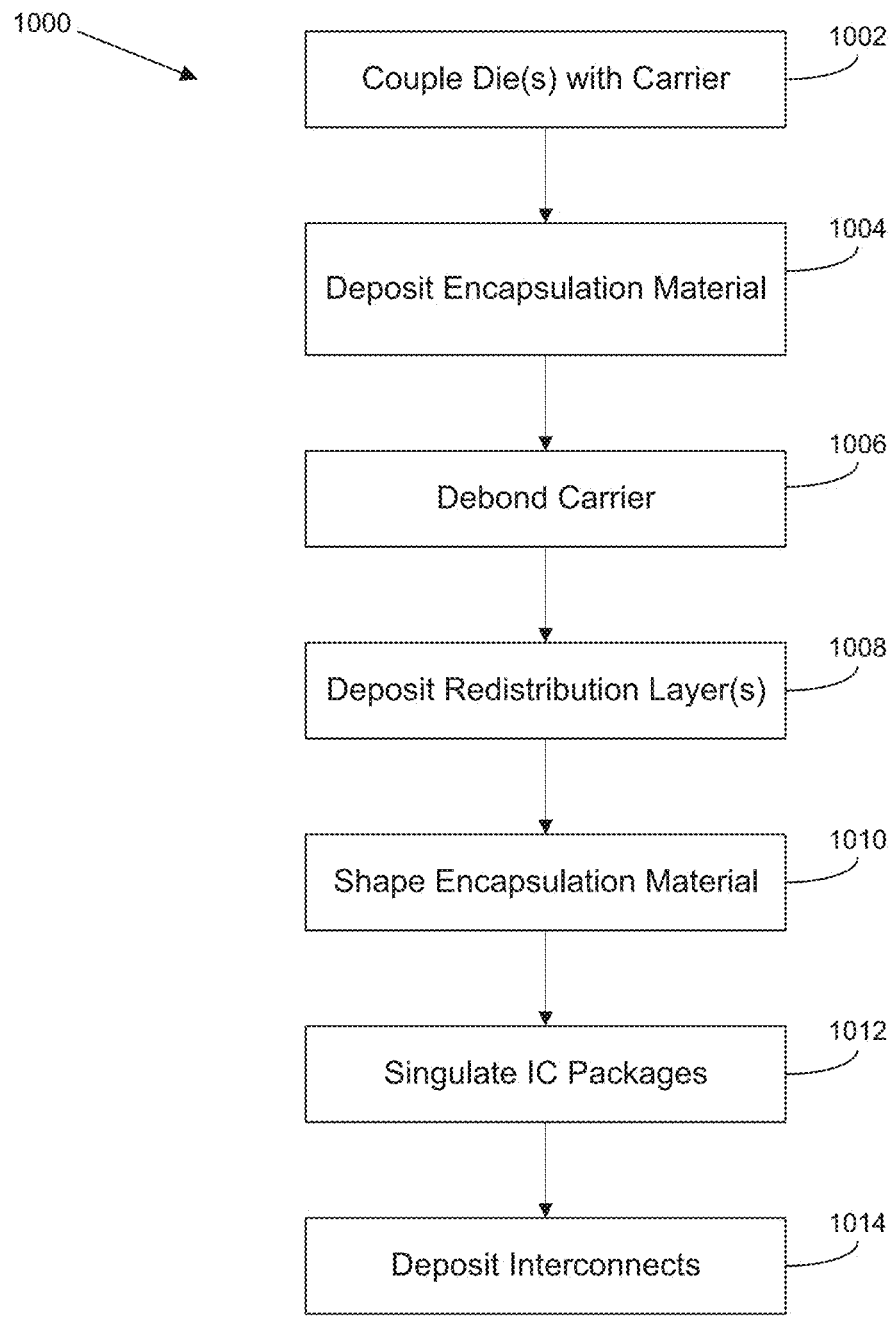
FIG. 10 is an illustrative flow diagram of an integrated circuit package fabrication process in accordance with some embodiments of the present disclosure.
Figure 11:
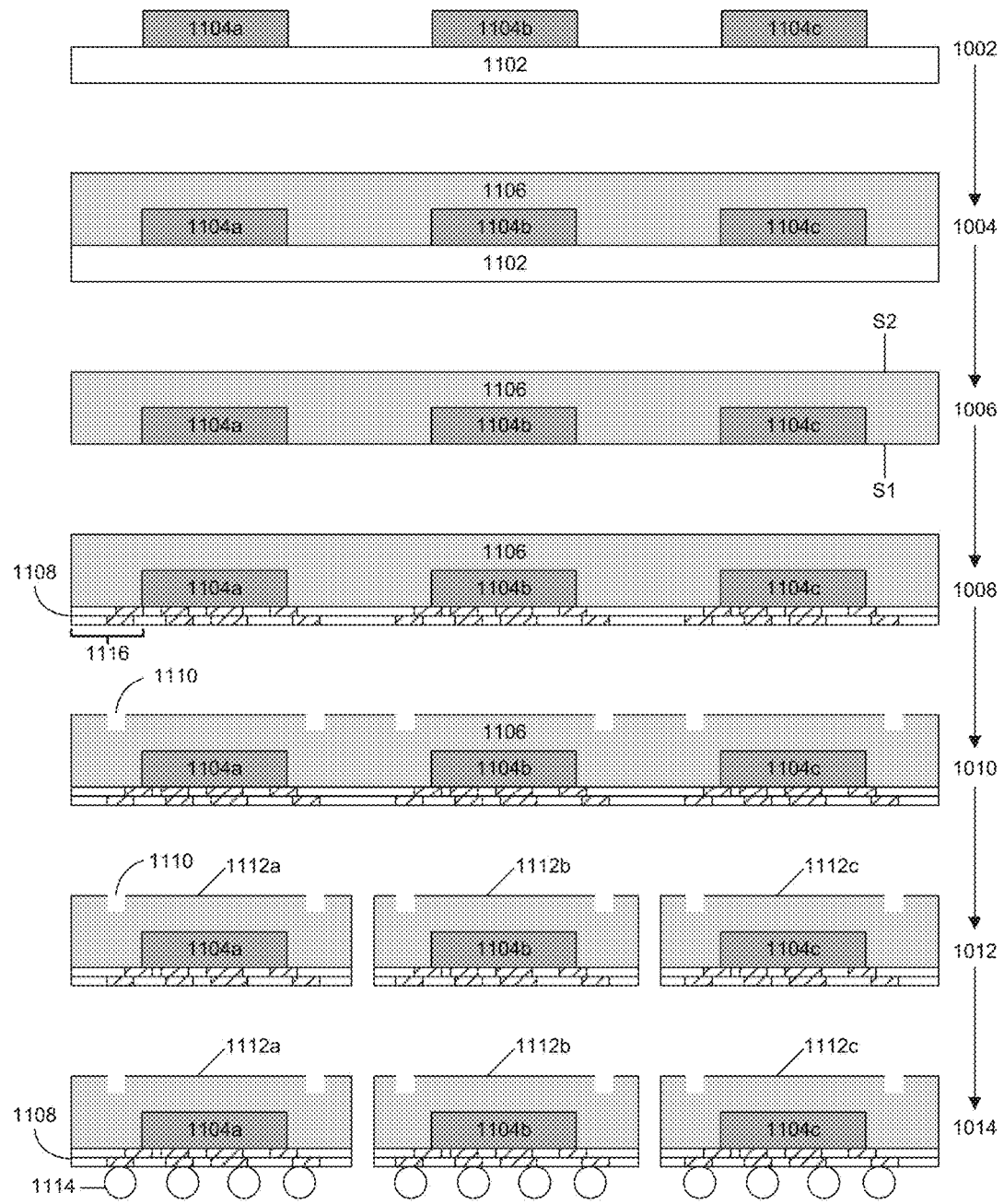
FIG. 11 is an illustrative cross-section view of selected operations illustrating stages in the integrated circuit package fabrication process described in FIG. 10, in accordance with some embodiments of the present disclosure.

FIG. 10 is an illustrative flow diagram of an illustrative fan-out wafer level packaging of integrated circuit packages in accordance with some embodiments of the present disclosure. FIG. 11 provides cross-section views of selected operations illustrating stages in the IC package substrate fabrication process 1000, in accordance with an illustrative embodiment. As a result, FIG. 10 and FIG. 11 will be described in conjunction with one another. To aid in this description, the operations performed in FIG. 10 are referenced on the arrows moving from operation to operation in FIG. 11. In addition, not all reference numbers are depicted in each operation in FIG. 11.

Process 1000 may begin at operation 1002 where one or more dies (e.g., dies 1104a-1104c of FIG. 11, hereinafter "dies 1104") may be coupled with a carrier (e.g., carrier 1102 of FIG. 11). The dies 1104 may be coupled with the carrier 1102 by way of a bonding material (not depicted), such as, for example, an adhesive, resin, or solder. An adhesive may be any type of die bonding adhesive, such as an epoxy adhesive. In some embodiments, an adhesive may include metal particles suspended in the adhesive to provide for thermal and or electrical conductivity. A resin may be, for example, a polyimide based resin or a thermoplastic. In embodiments utilizing a solder, the solder may include, for example, lead (Pb), gold (Au), silver (Ag), tin (Sn), or any combination thereof. In some embodiments, the material bonding dies 1104 to the carrier 1102 may be selected to make debonding of dies 1104 from the carrier 1102 more easily accomplished than with other materials.

In embodiments, carrier 1102 may be selected due to its coefficient of expansion to reduce or minimize expansion differences in the process flow. In embodiments, the carrier may be, for example, a glass or ceramic carrier.

Dies 1104 may be, include, or be a part of a processor, memory, or ASIC in some embodiments. While only three dies are depicted, this is merely for clarity and any suitable number of dies may be coupled with the carrier without departing from the scope of this disclosure. Dies 1104 may have die interconnect structures configured to electrically couple with a package substrate or circuit board.

At operation 1004 dies 1104 may be encapsulated in an encapsulation material 1106 such as a molding compound. While not depicted in FIG. 11, this operation may include shaping a surface of the encapsulation material, such as surface S2 depicted in FIG. 11, to cause the encapsulation material to vary in thickness which may result in one or more areas of a cross-section of the integrated circuit package being thinner than one or more other areas of the cross-section. This may be accomplished by applying a form, or cast, to stamp the molding compound into a shape, such as those described above. In other embodiments, the molding compound may be deposited by printing the molding compound over dies 1104 and carrier 1102. In such embodiments, the molding compound may be printed in a pattern resulting in one or more of the shapes described above.

At operation 1006 carrier 1102 may be decoupled from the IC package revealing a planar side S1 that is adjacent to or substantially coplanar with an exposed surface of dies 1104. As used herein, substantially coplanar is utilized to reflect that although the surface S1 and the surface of dies 1104 may not be perfectly coplanar, the surfaces are within a degree of coplanarity that a redistribution layer may be formed over surface S1 and the exposed surface of dies 1004. At operation 1008 one or more redistribution layers 1108 may be deposited over surface S1 and the exposed surface of dies 1004. In embodiments, redistribution layer 1108 may form a fan out area 1116.

At operation 1010, the encapsulation material may be shaped to cause the encapsulation material to vary in thickness which may result in one or more areas of a cross-section of the integrated circuit package being thinner than one or more other areas of the cross-section. This may be accomplished through the utilization of a saw, laser, or other suitable device configured to remove a portion of the encapsulation material to shape the encapsulation material (e.g., trench 1110 of FIG. 11). In some embodiments where the encapsulation material is shaped at operation 1004 operation 1010 may be unnecessary and may be omitted. In other embodiments, operation 1010 may be carried out in addition to any shaping of the encapsulation material to arrive at a combination of the shapes described above. For example, the encapsulation material may be stamped at operation 1004 to result in a beveled edge such as that depicted in FIG. 3, above, and, in addition, the encapsulation material may have trenches formed therein at operation 1010. In some embodiments, the IC package may undergo a backgrinding operation to thin the encapsulation material of the IC package prior to operation 1010. In such a backgrinding process, encapsulation material from side S2 may be removed to thin the IC package down to a level even with a surface of dies 1104. Then the thinned surface may be shaped at operation 1010 to cause the encapsulation material to vary in thickness which may result in one or more areas of a cross-section of the integrated circuit package being thinner than one or more other areas of the cross-section.

At operation 1012, chips 1112*a-c* may be separated through a singulation process. This may be accomplished utilizing a saw, laser, or other suitable device. Then at operation 1014 interconnect structures (e.g., solder balls 1114) may be formed on redistribution layer 1108.

Figure 12:
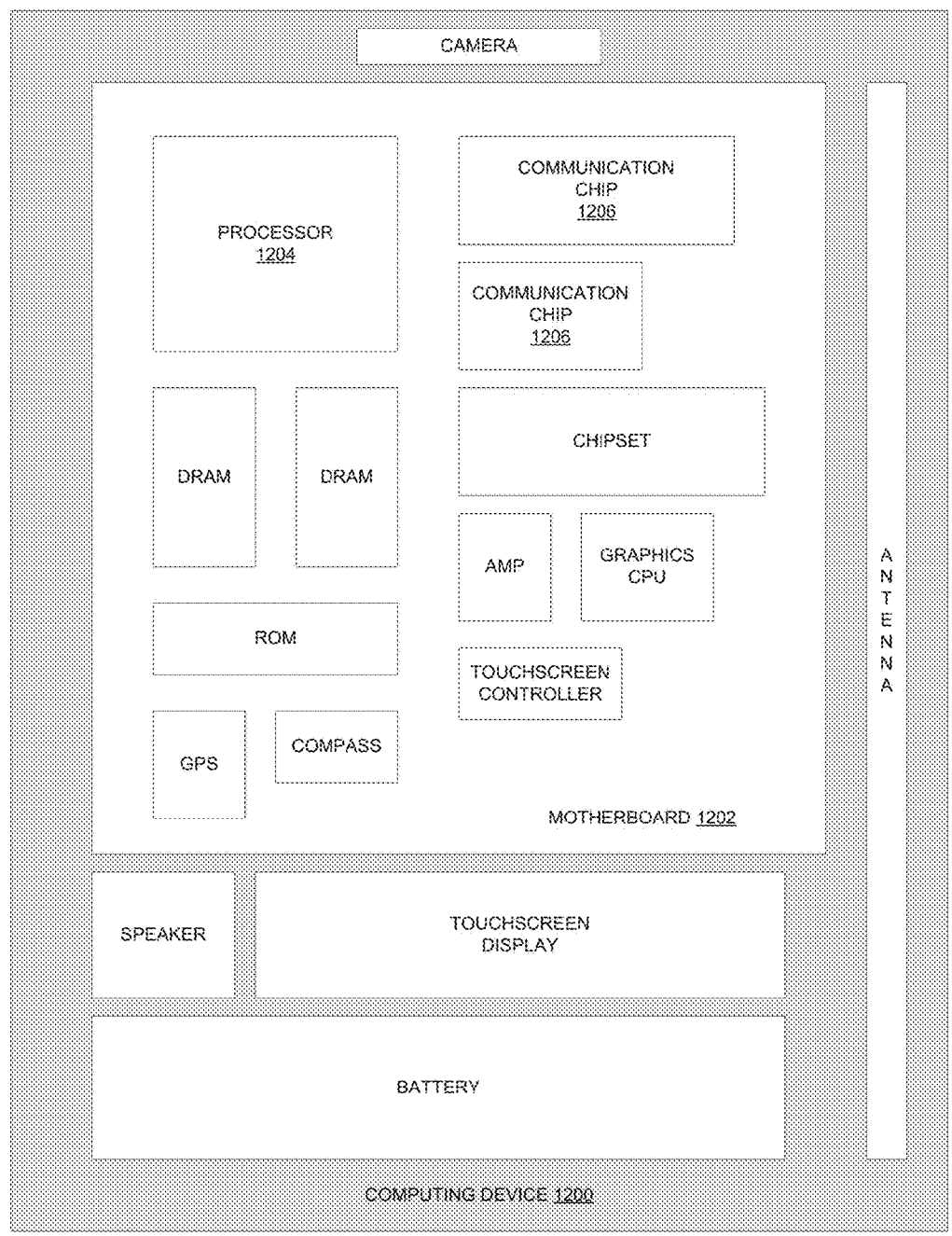
FIG. 12 schematically illustrates a computing device that includes an integrated circuit package, in accordance with some embodiments of the present disclosure.

Embodiments of the present disclosure may be implemented into a system using any suitable hardware and/or software to configure as desired. FIG. 12 schematically illustrates a computing device that includes an IC package as described herein, such as that depicted by FIGS. 1-8. The computing device 1200 may house a board such as motherboard 1202. The motherboard 1202 may include a number of components, including but not limited to a processor 1204 and at least one communication chip 1206. The processor 1204 may be physically and electrically coupled to the motherboard 1202. In some implementations, the at least one communication chip 1206 may also be physically and electrically coupled to the motherboard 1202. In further implementations, the communication chip 1206 may be part of the processor 1204.

Depending on its applications, computing device 1200 may include other components that may or may not be physically and electrically coupled to the motherboard 1202. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 1206 may enable wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 806 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1206 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1206 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, Ev-DO, and others.

The processor 1204 of the computing device 1200 may be an IC package (e.g., IC package 102 of FIG. 1) incorporated into an IC assembly. For example, the circuit board 116 of FIG. 1 may be a motherboard 1202 and the processor 1204 may be an IC package 102 as described herein. The processor 1204 and the motherboard 1202 may be coupled together using package-level interconnects as described herein. The term "processor" may refer to any device or portion of a device that processes electronic data from registers and/or memory to transform that electronic data into other electronic data that may be stored in registers and/or memory.

The communication chip 1206 may be an IC package (e.g., IC package 102) incorporated into an IC assembly that may include a package substrate. In further implementations, another component (e.g., memory device or other integrated circuit device) housed within the computing device 1200 may be an IC package (e.g., IC package 102) incorporated into an IC assembly.

In various implementations, the computing device 1200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

EXAMPLES

According to various embodiments, the present disclosure describes a number of examples. Example 1 is an integrated circuit package comprising: a die having a first side and a second side disposed opposite to the first side; an encapsulation material encapsulating at least a portion of the die and having a first surface that is adjacent to the first side of the die and a second surface disposed opposite to the first surface, wherein the second surface is shaped such that one or more cross-section areas of the IC package are thinner than one or more other cross-section areas of the IC package.

Example 2 may include the subject matter of Example 1, wherein the shape of the second surface reduces rigidity of the IC package.

Example 3 may include the subject matter of Example 2, wherein the one or more cross-section areas of the IC package comprise a portion of the encapsulation material disposed external to a region over the die defined by a peripheral edge of the die.

Example 4 may include the subject matter of Example 3, wherein the second surface slopes up from an edge of the portion of the encapsulation material such that the portion has a substantially beveled or chamfered profile.

Example 5 may include the subject matter of Example 3, wherein the portion of the encapsulation material has a step profile.

Example 6 may include the subject matter of Example 3, wherein the second surface has one or more trenches formed therein such that the one or more cross-section areas of the IC package are thinner than the one or more other cross-section areas of the IC package.

Example 7 may include the subject matter of Example 6, wherein the one or more trenches are between a terminating edge of the die and a corresponding terminating edge of the IC package.

Example 8 may include the subject matter of Example 7, wherein the one or more trenches comprise at least four trenches that form a perimeter around the die.

Example 9 may include the subject matter of Example 8, wherein the four trenches intersect at substantially right angles.

Example 10 may include the subject matter of any one of Examples 1-9, wherein: the die includes flip-chip interconnect structures; and the first surface includes redistribution features that are electrically coupled with the flip-chip interconnect structures; and the redistribution features form a fan out region of the IC package.

Example 11 is a method of assembling an integrated circuit package comprising: providing a die having a first side and a second side disposed opposite to the first side; depositing an encapsulation material to encapsulate one or more surfaces of the die in the encapsulation material, the encapsulation material forming a first surface that is adjacent to the first side of the die and a second surface, opposite the first surface; and shaping the second surface of the encapsulation material to cause the encapsulation material to vary in thickness resulting in one or more areas of a cross-section of the integrated circuit package being thinner than one or more other areas of the cross-section.

Example 12 may include the subject matter of Example 11, wherein shaping the second surface of the encapsulation material comprises stamping the second surface of the encapsulation material to cause the encapsulation material to vary in thickness.

Example 13 may include the subject matter of Example 11, wherein shaping the second surface of the encapsulation material comprises selectively removing encapsulation material from the second surface of the encapsulation material to cause the encapsulation material to vary in thickness.

Example 14 may include the subject matter of Example 11, wherein shaping the second surface of the encapsulation material comprises shaping a portion of the second surface disposed external to a region over the die that is defined by a peripheral edge of the die.

Example 15 may include the subject matter of Example 14, wherein shaping the portion of the second surface comprises beveling or chamfering of an edge of the portion of the second surface.

Example 16 may include the subject matter of Example 14, wherein shaping the portion of the second surface comprises forming one or more steps in the portion of the second surface.

Example 17 may include the subject matter of any one of Examples 11-13, wherein shaping the second surface of the encapsulation material comprises forming one or more trenches in the second surface.

Example 18 may include the subject matter of Example 17, wherein forming one or more trenches comprises forming at least four trenches to form a perimeter around the die.

Example 19 is a package assembly comprising: an integrated circuit (IC) package including: a die having a plurality of input/output (I/O) interconnect structures, a first side and a second side disposed opposite to the first side; an encapsulation material encapsulating at least a portion of the die and having a first surface that is adjacent to the first side of the die and a second surface disposed opposite to the first surface, wherein the second surface is shaped such that one or more cross-section areas of the IC package are thinner than one or more other cross-section areas of the IC package; and a package substrate including a first side having one or more lands disposed thereon; and a second side disposed opposite to the first side, the second side having one or more electrical routing features disposed thereon, the electrical routing features electrically coupled with the plurality of I/O interconnect structures.

Example 20 may include the subject matter of Example 19, wherein the IC package is a processor.

Example 21 may include the subject matter of Example 20, further comprising one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board, wherein the package assembly is part of a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit (IC) package comprising: a die having a first side and a second side disposed opposite to the first side; an encapsulation material encapsulating at least a portion of the die and having a first surface that is adjacent to the first side of the die and a second surface disposed opposite to the first surface, wherein the encapsulation material includes a first side, a second side, a third side, and a fourth side disposed between the first surface and the second surface, wherein the second side is directly adjacent to the first side, the third side is directly adjacent to the second side, and the fourth side is directly adjacent to the third side, wherein the first side and the second side of the encapsulation material are substantially perpendicular to one another, and wherein the third side and the fourth side of the encapsulation material are substantially perpendicular to each other; a first trench formed in the second surface, wherein the trench extends from the first side to the second side of the encapsulation material, a second trench formed in the second surface, wherein the second trench extends from the second side to the third side of the encapsulation material, a third trench formed in the second surface, wherein the third trench extends from the third side to the fourth side of the encapsulation material; and a fourth trench formed in the second surface, wherein the fourth trench extends from the fourth side to the first side of the encapsulation material, wherein the first, second, third, and fourth trenches intersect respectively first, second, third, and fourth sides under varying angles such that the first, second, third and fourth trenches form a geometric figure other than a square, wherein the second surface of the encapsulating material has a shape such that one or more cross sectional areas is thinner than one or more other cross sectional areas, and the trenches are formed at various depths to achieve the thinner cross sectional areas.

2. The IC package of claim 1, wherein a shape of the second surface that includes the trenches reduces rigidity of the IC package.

3. The IC package of claim 1, wherein at least some of the trenches are unfilled.

4. The IC package of claim 1, wherein: the die includes flip-chip interconnect structures; and the first surface includes redistribution features that are electrically coupled with the flip- chip interconnect structures; and the redistribution features form a fan out region of the IC package.

* * * * *